United States Patent
Kim et al.

(10) Patent No.: US 8,810,273 B1
(45) Date of Patent: Aug. 19, 2014

(54) APPARATUS AND METHODOLOGY FOR INSTANTANEOUS AC LINE FAULT DETECTION

(75) Inventors: Sangsun Kim, San Jose, CA (US); Ho Kong Mah, San Jose, CA (US)

(73) Assignee: Google Inc., Mountain View, CA (US)

( * ) Notice: Subject to any disclaimer, the term of this patent is extended or adjusted under 35 U.S.C. 154(b) by 409 days.

(21) Appl. No.: 13/297,061

(22) Filed: Nov. 15, 2011

(51) Int. Cl.
| | | |
|---|---|---|
| *G01R 31/40* | (2014.01) | |
| *G01R 19/00* | (2006.01) | |
| *G01R 31/02* | (2006.01) | |
| *G05B 23/02* | (2006.01) | |

(52) U.S. Cl.
CPC ............ *G01R 31/40* (2013.01); *G01R 19/0084* (2013.01); *G01R 31/024* (2013.01); *G01R 31/025* (2013.01); *G01R 31/026* (2013.01); *G05B 23/02* (2013.01)
USPC ........................................ 324/764.01; 702/64

(58) Field of Classification Search
CPC ........ G01R 31/40; G01R 31/42; G01R 31/02; G01R 31/024; G01R 31/025; G01R 31/026; G01R 19/0084; G01R 19/0092; G05B 23/02
USPC ......... 324/500, 509, 511, 512, 521, 522, 525, 324/526, 528, 531, 537, 541, 544, 555, 324/713; 702/1, 57, 58, 59, 64, 185
See application file for complete search history.

(56) References Cited

U.S. PATENT DOCUMENTS

| | | | | |
|---|---|---|---|---|
| 6,038,516 | A | * | 3/2000 | Alexander et al. .............. 702/67 |
| 2007/0005194 | A1 | * | 1/2007 | Chang et al. ................... 700/292 |
| 2009/0287430 | A1 | * | 11/2009 | Atoji et al. ....................... 702/58 |
| 2013/0094258 | A1 | * | 4/2013 | Royak et al. ..................... 363/89 |

\* cited by examiner

*Primary Examiner* — Hoai-An D Nguyen
(74) *Attorney, Agent, or Firm* — Fish & Richardson P.C.

(57) ABSTRACT

Provided is an apparatus that includes sensors configured to ascertain two or more alternating current voltage signals. In some aspects, a first AC voltage is sensed at a resistor branch and a second AC voltage is sensed at a resistor-capacitor branch. A processor is configured to transform the two alternating current voltage signals into two instantaneous direct current voltage values. Analysis of at least one direct current value is performed to determine whether or not the instantaneous RMS line voltage is within or outside the range of the required (or expected) RMS line voltage. If the direct current value indicates that the line voltage is outside the expected RMS voltage value, it is determined that an alternating current line fault has occurred or is occurring.

20 Claims, 10 Drawing Sheets

US 8,810,273 B1

APPARATUS AND METHODOLOGY FOR INSTANTANEOUS AC LINE FAULT DETECTION

TECHNICAL FIELD

The subject disclosure relates to power supplies, and more particularly, to apparatuses and methodologies that identify an alternating current (AC) line fault at about the same time the fault occurs.

BACKGROUND

Modern data centers and telecommunication systems regularly use alternating current (AC) power sources to operate various electric loads, for example, servers. In applications such as data centers, the high availability and redundancy of the AC power sources is important. However, sometimes AC power sources can malfunction and introduce faulty conditions in systems that they are powering. AC line faults can include short circuit and open circuit conditions. AC line faults can have adverse impacts on system performance, can damage system components, and can have other undesirable consequences such as automatic and abrupt shutdown of the system. In conventional systems, there is a significant period of time that elapses between when the fault occurs and when the fault is detected. In some situations, the delay can be around 10 milliseconds or more. Fast detection of faulty AC line conditions would be desirable, so that the faulty conditions can be promptly addressed.

SUMMARY

A simplified summary is provided herein to help enable a basic or general understanding of various aspects of exemplary, non-limiting implementations that follow in the more detailed description and the accompanying drawings. This summary is not intended, however, as an extensive or exhaustive overview. Instead, the sole purpose of this summary is to present some concepts related to some exemplary non-limiting implementations in a simplified form as a prelude to the more detailed description of the various implementations that follow.

In an exemplary implementation, an alternating current (AC) primary power source is coupled in parallel with a resistor divider circuit. A resistor-capacitor (RC) circuit is coupled in parallel with the resistor divider circuit. A first AC voltage signal is sensed at a node in the resistor divider circuit and a second AC voltage signal is sensed at a node in the RC circuit. The first and second sensed AC voltage signals are used to determine first and second values. A fault is determined to have occurred if the first value is not indicative of the required root mean square (RMS) value of a line voltage provided by the primary power source.

These and other implementations are described in more detail below.

BRIEF DESCRIPTION OF THE DRAWINGS

Various non-limiting implementations are further described with reference to the accompanying drawings in which.

DETAILED DESCRIPTION

Various aspects or features of the subject disclosure are described with reference to the drawings. In the subject specification, numerous specific details are set forth in order to provide a thorough understanding of the subject disclosure. It may be evident, however, that the disclosed subject matter may be practiced without these specific details, or with other methods, components, materials, and so forth. In other instances, well-known structures and devices are shown in block diagram form in order to facilitate describing the subject disclosure.

Figure 1:
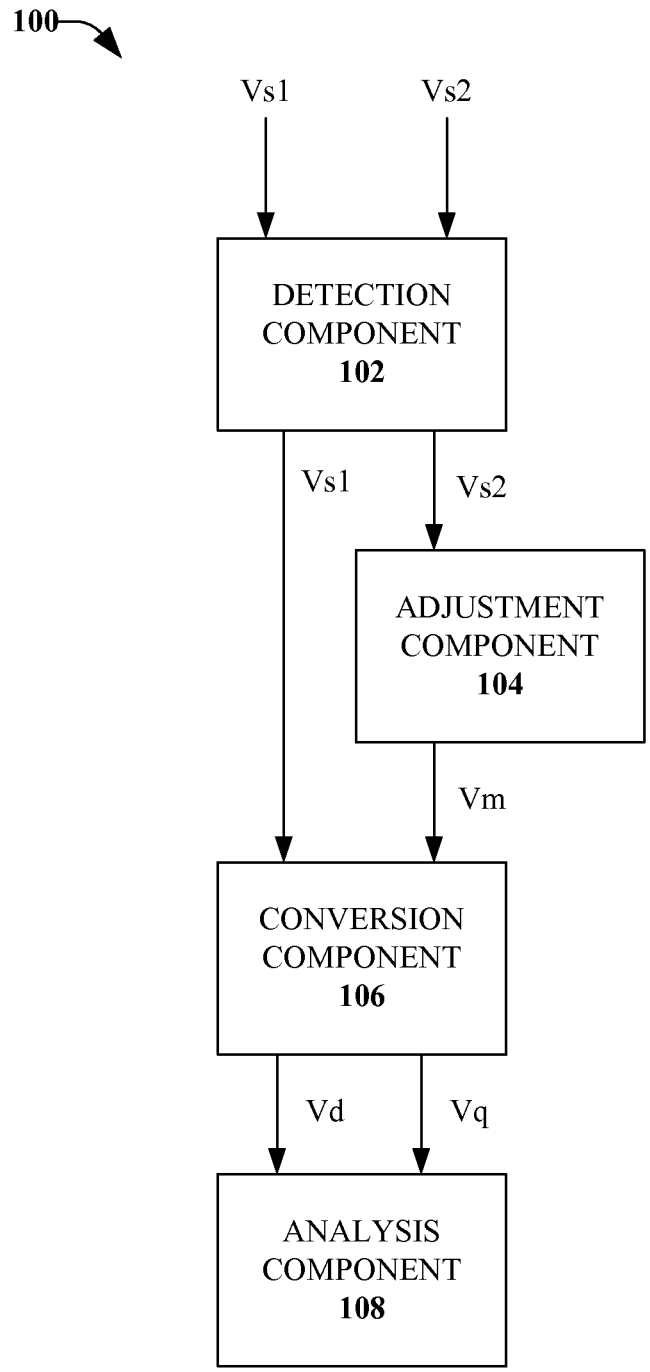
FIG. 1 illustrates an exemplary system configured to detect an AC line fault.

Referring initially to FIG. 1, illustrated is an exemplary system 100 configured to detect an alternating current (AC) line fault, according to an aspect. AC line frequency is usually either 50 Hz or 60 Hz (e.g., 50 Hz in Europe and 60 Hz in the United States of America). Therefore, it can take some time (e.g., around 10 milliseconds or more) to detect an AC fault or failure. In some instances, the delay between when the fault occurs and when the fault is detected (and subsequent action taken to reduce the impact of the fault) can cause an interruption in services, or cause other problems (e.g., damages to components).

To overcome the above-mentioned delay, system 100 can be configured to detect the AC line fault at about the same time as the fault occurs or instantaneously. As utilized herein, the term "instantaneously" means within a reasonable amount of time, taking into account the time needed for circuitry to perform its functions. In accordance with some aspects, system 100 is configured to detect the AC line fault by transforming two or more sensed AC signals into the direct current (DC) domain instantaneously, or almost instantaneously.

System 100 can be utilized with various applications in order to more quickly detect an AC line fault, as compared to traditional fault detection techniques. The quicker detection of the fault can be utilized to automatically adjust a transfer (or toggle) switch (e.g., switch from a first or primary power source or supply to a second or backup power source or supply) in order to provide continuous power coverage in the event of a fault.

For example, system 100 can be utilized with an uninterrupted power supply (UPS) with battery backup. A UPS refers to a system that provides backup power to a load during loss of an input power source and is used in applications where continuous power is needed. A UPS system can be implemented to protect electrical systems from corruption and/or loss of data. In an example, the backup power is provided by a battery that is connected in parallel with the load. During normal operation, the input power source delivers power to the load and charges the battery. However, during a loss of the input power source, the battery supplies the power to the load. As a result, an uninterrupted supply of power can be provided to the load.

In another example, system 100 can be utilized with a dual AC line input (2N AC) for redundancy purposes. Further to this example, a configuration typically utilizes dual (2N) power supplies. However, with a fast transfer switch, which can be applied with the instantaneous AC fault detection, as disclosed herein, only a single set of power supplies (1N) might be used in certain applications, which can provide cost advantages as well as other advantages (e.g., fewer components, smaller footprint, and so forth).

In accordance with some aspects, system 100 is configured to detect an AC line root mean square (RMS) voltage instantaneously, or almost instantaneously (e.g., in real-time). RMS is a statistical measure of the magnitude of a varying quantity. For example, system 100 can be configured to detect actual RMS current in real-time by implementation of a resistor-capacitor (RC) circuit, as will be described in further detail below.

System 100 includes a detection component 102 configured to sense a first AC voltage signal Vs1 and a second AC voltage signal Vs2. In accordance with some aspects, a single detection component 102 is utilized to sense the signals. However, in some aspects, separate detection components are utilized to sense the signals. For example, a first detection component is configured to detect the first AC voltage signal Vs1 and a second detection component is configured to detect the second AC voltage Vs2. For example, the first detection component measures the first AC signal in a resistive branch of a circuit and the second AC signal is measured in a parallel resistor-capacitor (RC) branch of the circuit. In accordance with some aspects, the detection component 102 is a voltmeter or another device configured to sense or measure voltage (e.g., a microcontroller, a potentiometer, an oscilloscope, an instrumentation amplifier and so forth).

Figure 2:
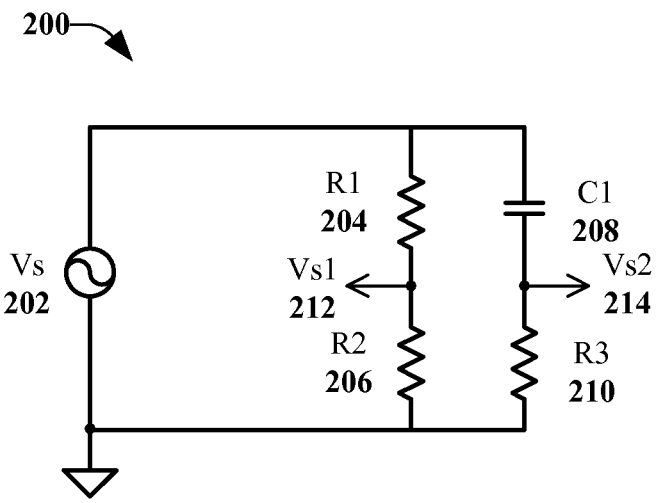
FIG. 2 illustrates an exemplary circuit configured to detect an AC line fault.

According to some aspects, the first AC voltage signal Vs1 and the second AC voltage signal Vs2 can be sensed by detection component 102 through utilization of the circuit 200, as illustrated in FIG. 2. Included in the circuit 200 is a voltage source Vs 202. Also included in the circuit 200 are a first resistor R1 204 and a second resistor R2 206 (e.g., resistive branch) coupled in parallel with a first capacitor C1 208 and a third resistor R3 210 (e.g., resistor-capacitor branch). In accordance with some implementations, if an electromagnetic interference (EMI) filtering capacitor in the power supply is available, the EMI filtering capacitor can be utilized as C1.

The first AC voltage signal Vs1 212 is sampled or sensed, at a node, by the detection component 102 (of FIG. 1) in the resistive branch (e.g., at a first node located between the first resistor 204 and the second resistor 206). The second AC voltage signal Vs2 214 is sampled or sensed, at a node, by the detection component 102 (of FIG. 1) in the RC branch of an RC circuit 200 (e.g., at a second node located between the first capacitor 208 and the third resistor 210). In some implementations, the second AC voltage signal Vs2 214 can be about 90 degrees phase shifted from the first AC voltage signal Vs1 212 when the circuit 200 is utilized.

Figure 3:
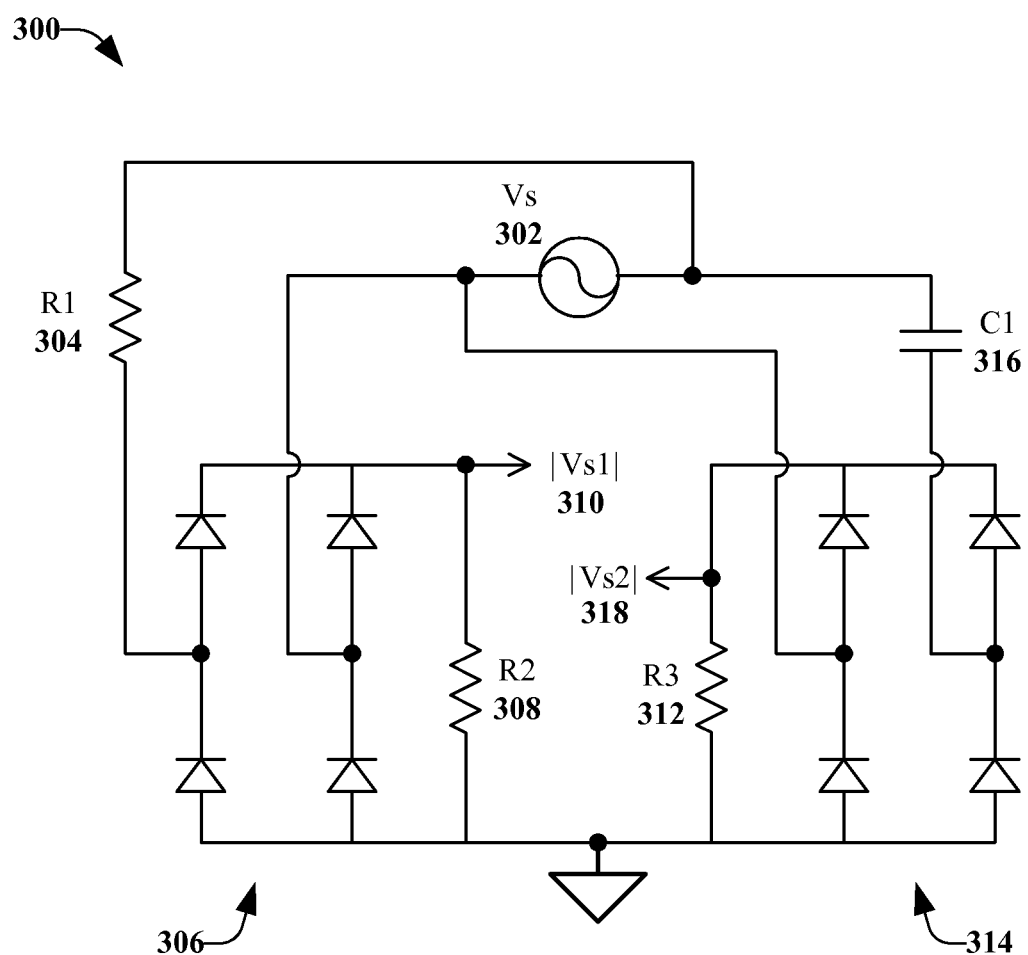
FIG. 3 illustrates an example of a voltage sense circuit.

FIG. 3 illustrates an example of a voltage sense circuit 300, according to an aspect. In this example circuit 300, bridge rectifiers are utilized to perform the rectification. Similar to the above figure, included is a voltage source 302. Also included is a first resistor R1 304, a first bridge rectifier 306, and a second resistor R2 308. A first voltage Vs1 310 is sensed at a first node, as illustrated. The example circuit 300 also includes a third resistor R3 312, a second bridge rectifier 314, and a first capacitor C1 316. A second voltage Vs2 318 is sensed at a second node, as illustrated.

Figure 4:
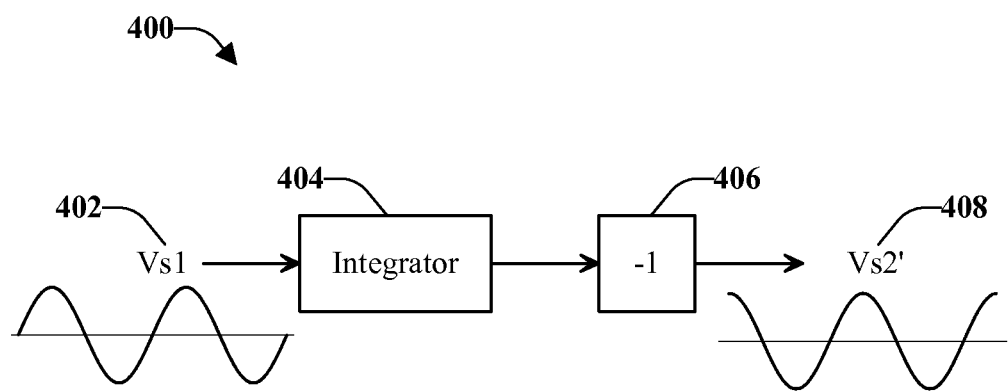
FIG. 4 illustrates an alternative implementation for obtaining a second alternating current voltage signal.

In accordance with an alternative aspect, a second voltage signal Vs2' can be derived from the first AC voltage signal Vs1, as illustrated by the alternative implementation 400 of FIG. 4. In accordance with this aspect, the first AC voltage signal Vs1 402 (which can have the illustrated exemplary waveform), is received by an integrator 404. The integrator 404 is configured to block a DC signal associated with the first AC voltage signal Vs1 402 and to pass only the AC portion of the first AC voltage signal Vs1 402. Also included in the alternative implementation 400 is a phase shifter 406 configured to shift phase (or polarity) of the AC portion by 90 degrees. An output of the phase shifter 406 is utilized as the second AC voltage signal Vs2' 408. As illustrated, the second AC voltage signal Vs2' 408 (which can have the illustrated exemplary waveform) is phase shifted by about 90 degrees as compared to the waveform of the first AC voltage signal Vs1 402.

Figure 5:
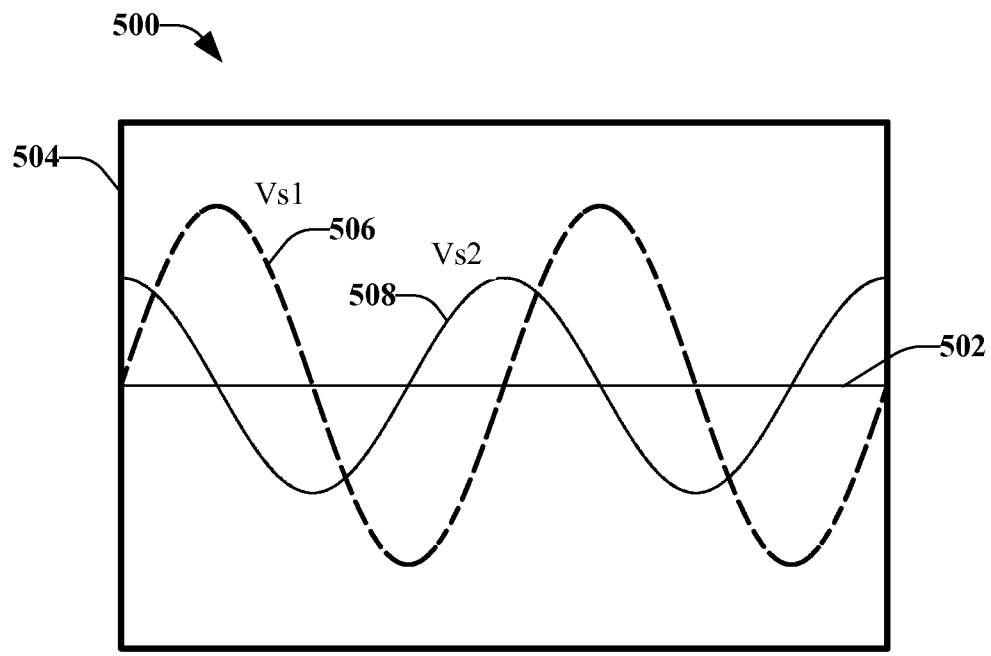
FIG. 5 illustrates waveforms representing exemplary sensed alternating current voltage signals.

With reference again to FIG. 1, as a result of being processed by an RC circuit (such as the RC circuit illustrated in FIG. 2 or 3), the second AC voltage signal Vs2 might not have the same (or substantially the same) magnitude as the magnitude of the first AC voltage signal Vs1. The difference in the magnitude of the second AC voltage signal Vs2 can be a result of the tolerance of the capacitor (e.g., first capacitor C1 208 of FIG. 2) and third resistor (e.g., third resistor R3 210 of FIG. 2). To demonstrate, FIG. 5 illustrates a chart 500 of exemplary sensed AC voltage signals, according to an aspect. In the chart 500, time is represented along the horizontal axis 502 and magnitude is represented along the vertical axis 504. Positive magnitude is represented by the portions of the waveforms above the horizontal axis 502 and negative magnitude is represented by the portions of the waveforms below the horizontal axis 502.

The first AC voltage signal Vs1, which can be sensed at a node between the first resistor R1 204 and the second resistor R2 206 (both of FIG. 2), is illustrated by first waveform 506. In some aspects, first waveform 506 can be sampled by the detection component 102 of FIG. 1. The second AC voltage signal Vs2, which can be sensed at a node between the first capacitor 208 and the third resistor R3 210 (both of FIG. 2), is illustrated by second waveform 508.

As shown, the first AC voltage signal Vs1 506 has a first magnitude that is different from a second magnitude of the second AC voltage signal Vs2 508. In order to obtain instantaneous DC voltages of both AC voltage signals to quickly detect an AC line fault, the second AC voltage signal Vs2 should be calibrated to have a magnitude that is substantially the same as the magnitude of the first AC voltage signal Vs1. To facilitate the calibration, an adjustment component 104 (FIG. 1) can be configured to calibrate the second AC voltage signal Vs2 such that a magnitude of the second AC voltage signal Vs2 is substantially the same as a magnitude of the first AC voltage signal Vs1. The output of the adjustment component is a calibrated second AC voltage Vm.

In accordance with some aspects, the adjustment component 104 is a microcontroller. The microcontroller that can be used in the various implementations of the present invention can be implemented in hardware, software or firmware. The microcontroller can be programmable. In accordance with other aspects, the adjustment component 104 can be any device configured to modify a magnitude of the AC voltage signals.

According to an aspect, adjustment component 104 can utilize a feedback loop, wherein the adjustment to the second AC voltage signal Vs2 is monitored continuously, periodically, randomly, or based on another time interval. Further to this aspect, the amount of adjustment needed to make the magnitude of the second AC voltage signal Vs2 substantially the same as the first AC voltage signal Vs1 can change over time. The feedback loop and subsequent adjustments can be implemented dynamically such that instantaneous, or near instantaneous, AC line fault detection can be automatically implemented as disclosed herein.

Figure 6:
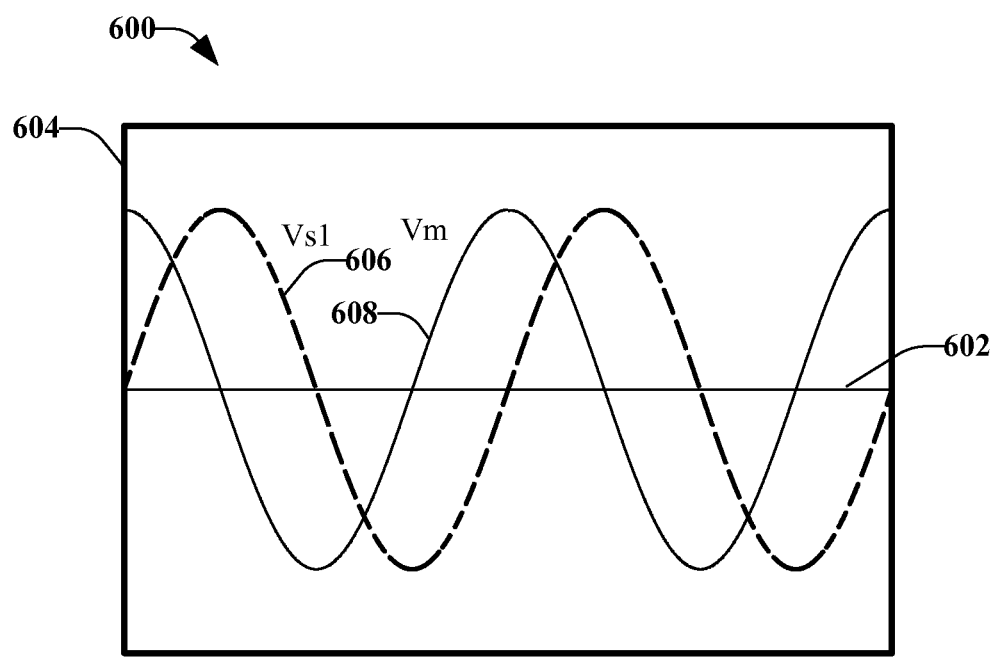
FIG. 6 illustrates waveforms of FIG. 5 after calibration.

For example purposes, FIG. 6 illustrates a chart 600 representing the exemplary voltage sense signals of FIG. 5 after calibration, according to an aspect. Similar to FIG. 5, time is represented along the horizontal axis 602 and magnitude is represented along the vertical axis 604. Positive magnitude is represented by the portions of the waveforms above the horizontal axis 602 and negative magnitude is represented by the portions of the waveforms below the horizontal axis 602.

Illustrated are the first AC voltage signal Vs1 waveform 606, which has the same pattern as the first waveform 506 of FIG. 5. The calibrated second AC voltage Vm (derived from the second AC voltage signal Vs2) is represented by the second waveform 608. A comparison of the second waveform 508 of FIG. 5 and the second waveform 608 of FIG. 6 illustrates the result of the calibration of the second AC voltage signal Vs2. For example, in FIG. 5, the first waveform 506 and second waveform 508 had different magnitudes (e.g., the magnitude of the second waveform 508 is smaller than the magnitude of the first waveform 506). However, after calibration (FIG. 6), the first waveform 606 and the second waveform 608 have substantially the same magnitude. Further, as illustrated, the first waveform 606 and the second waveform 608 are about 90 degrees out of phase.

With reference again to FIG. 1, system 100 also includes a conversion component 106 configured to transform the first AC voltage signal Vs1 and the calibrated second AC voltage Vm into a first DC value Vd and a second DC value Vq. In accordance with some aspects, the first DC value represents root mean square level of the first alternating current voltage signal. In some aspects, Vd is directly proportional to the required AC RMS line voltage. In an aspect, Vq can be equal to zero, or substantially equal to zero, if the two signals (Vd and Vq) are 90 degrees apart and the magnitude of the two signals are substantially the same (as illustrated in FIG. 6).

The equations for obtaining instantaneous DC voltages Vd and Vq are as follows:

$$\begin{bmatrix} V_d \\ V_q \end{bmatrix} = T(\theta) \begin{bmatrix} V_{s1} \\ V_m \end{bmatrix}. \quad \text{Equation 1}$$

where Vs1 is the first AC voltage signal, Vm is the calibrated second voltage signal and transformation matrix T(θ) is:

$$T(\theta) = \begin{bmatrix} \sin\theta & \cos\theta \\ -\cos\theta & \sin\theta \end{bmatrix}. \quad \text{Equation 2}$$

$$T(\theta)^{-1} = \begin{bmatrix} \sin\theta & -\cos\theta \\ \cos\theta & \sin\theta \end{bmatrix}. \quad \text{Equation 3}$$

where θ=2πf·t, and f is the AC line frequency, and where θ is determined at each zero crossing of the AC voltage. The two instantaneous DC components as a function of time t are:

$$\begin{bmatrix} V_d \\ V_q \end{bmatrix} = \begin{bmatrix} (V_{s1}\sin\theta + V_m\cos\theta) \\ (-V_{s1}\cos\theta + V_m\sin\theta) \end{bmatrix}. \quad \text{Equation 4}$$

The RMS voltage is obtained by the following:

$$\text{RMS Voltage} = \frac{V_d}{\sqrt{2}}. \quad \text{Equation 5}$$

An analysis component 108 is configured to evaluate the first DC value Vd and the second DC value Vq for a line fault. For example, analysis component 108 can be configured to evaluate the result of the transform, namely, the first DC value Vd and the second DC value Vq. The first DC value Vd is substantially proportional (or directly proportional) to the required AC RMS voltage. The second DC value Vq would be zero if the two signals (e.g., first AC voltage signal Vs1 and second AC voltage signal Vs2 or the calibrated second voltage signal Vm) are exactly (or substantially) 90 degrees away from each other and the magnitudes of both voltage signals are the same or substantially the same. AC line fault is indicated from the first DC value Vd, which represents the RMS voltage of the AC line. For example, the line fault is indicated if the first direct current value does not correspond with the required (or desired or expected) AC RMS voltage, which can be a voltage range, according to an aspect. In an example, the input AC line voltage can vary from 0 to 150 VAC. For a particular application, the specification can require an input AC line voltage (e.g. Vs 202 in FIG. 2) of between 100 and 120 volts. In this example, the system controller (e.g. microcontroller) can be programmed to determine that a fault condition exists if the RMS value of the AC line voltage is less than 100 volts. In other words, the required RMS voltage value for the AC line must be at least 100 volts. The microcontroller can be programmed to set a minimum Vd threshold corresponding to 100 volts RMS. In another example, the minimum required RMS voltage value for the AC line can be set at 50 volts or another RMS voltage value. A maximum limit can also be set for the required RMS voltage value thereby creating a range of acceptable (or required) AC line RMS voltages. The ac voltage can be anything between 0 to 150 Vac or so. Based on the specification for the ac line, the controller knows the fault condition immediately.

The indication of an AC line fault can result in changing from a first power source to a second power source in order to provide continuous coverage despite the occurrence of the AC line fault.

Figure 7:
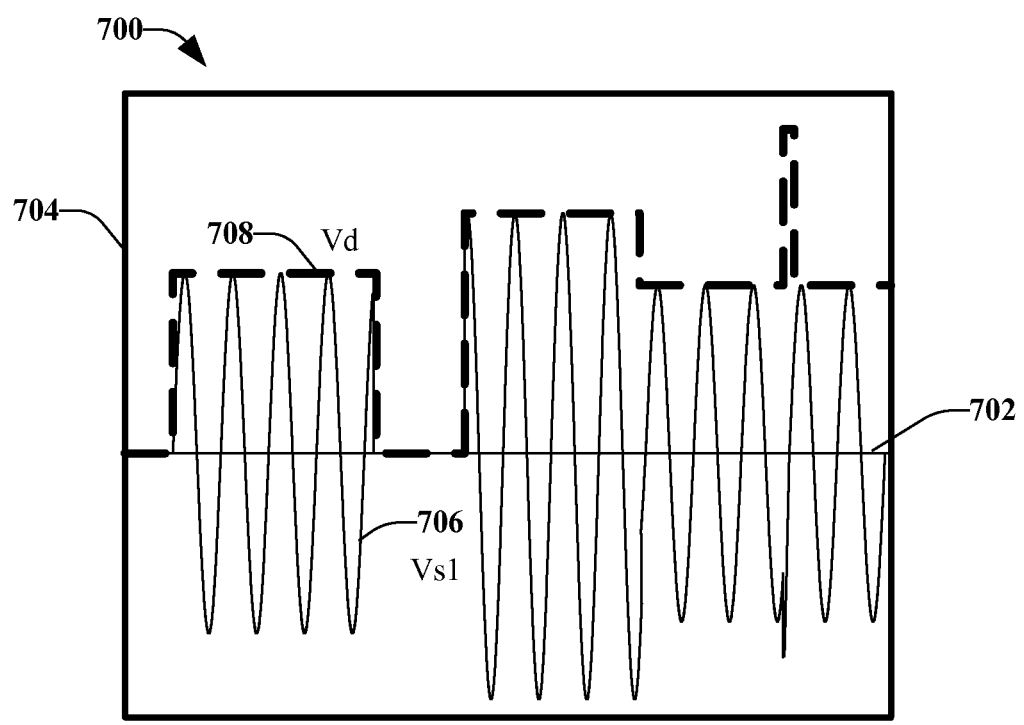
FIG. 7 illustrates an exemplary instantaneous direct current voltage waveform associated with a sensed AC voltage signal.

FIG. 7 illustrates a chart 700 of an exemplary instantaneous DC voltage (Vd) detection from an AC line voltage, according to an aspect. The horizontal axis 702 represents time and the vertical axis 704 represents magnitude. Positive magnitude is represented by the portions of the waveforms above the horizontal axis 702 and negative magnitude is represented by the portions of the waveforms below the horizontal axis 702.

The AC line voltage Vs1 is represented by the waveform 706. The instantaneous DC voltage Vd is represented by line 708. As shown, the instantaneous DC voltage Vd is detected directly from the AC line voltage Vs1. In some aspects, the conversion component 106 (of FIG. 1) transforms the first AC voltage source Vs1 directly into the first DC value Vd as indicated by FIG. 7.

Figure 8:
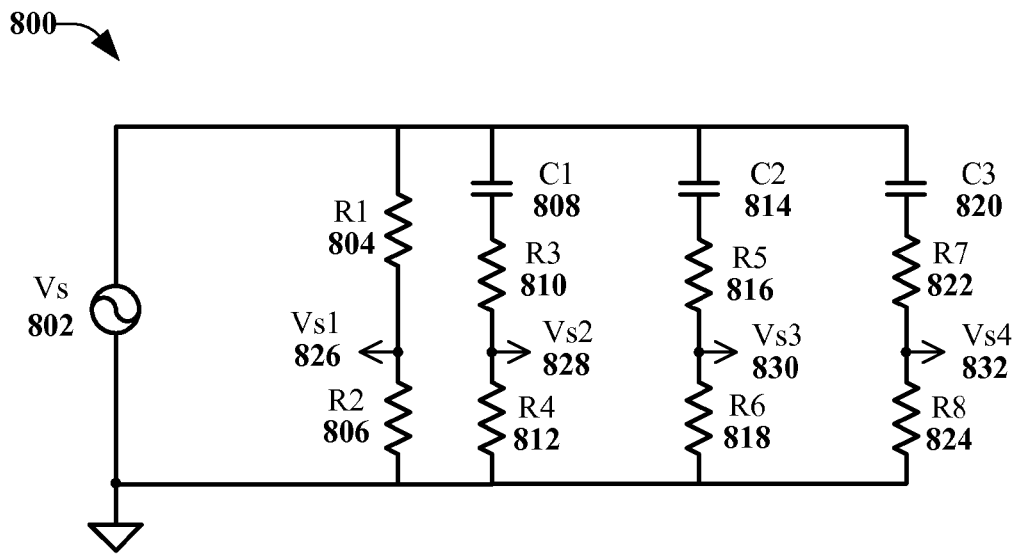
FIG. 8 illustrates an alternate implementation of a circuit for instantly detecting an alternating current line fault.

FIG. 8 illustrates an alternate implementation of a circuit 800 for quickly detecting an AC line fault, according to an aspect. In this implementation, several RC circuits with phase shifters of different phase shifting capabilities are utilized. As illustrated, the circuit 800 includes a power source Vs 802. A first branch of the circuit 800 comprises a first resistor R1 804 and second resistor R2 806, which are in parallel with a second branch that comprises a first capacitor C1 808, a third resistor R3 810, and a fourth resistor R4 812. A third branch, which is in parallel with the first branch and second branch, comprises a second capacitor C2 814, a fifth resistor R5 816, and a sixth resistor R6 818. In parallel with the aforementioned branches is a fourth branch that includes a third capacitor C3 820, a seventh resistor R7 822, and an eighth resistor R8 824. It should be noted that the number of sensed nodes is not limited to four nodes.

A first voltage Vs1 826 can be sensed at a node between the first resistor R1 804 and the second resistor R2 806. A second voltage Vs2 828 can be sensed at a node between the third resistor R3 810 and the fourth resistor R4 812. A third voltage Vs3 830 can be sensed at a node between the fifth resistor R5 816 and the sixth resistor R6 818. A fourth voltage Vs4 832 can be sensed at a node between the seventh resistor R7 822 and the eighth resistor R8 824. In some aspects, the voltages are sensed by a single component (e.g., detection component 102 of FIG. 1, a voltage detector, and so forth). In other aspects, one or more of the voltages are sensed by different components (e.g., first voltage is measured by a first voltmeter, second voltage is measured by a second voltmeter, and so forth).

Figure 9:
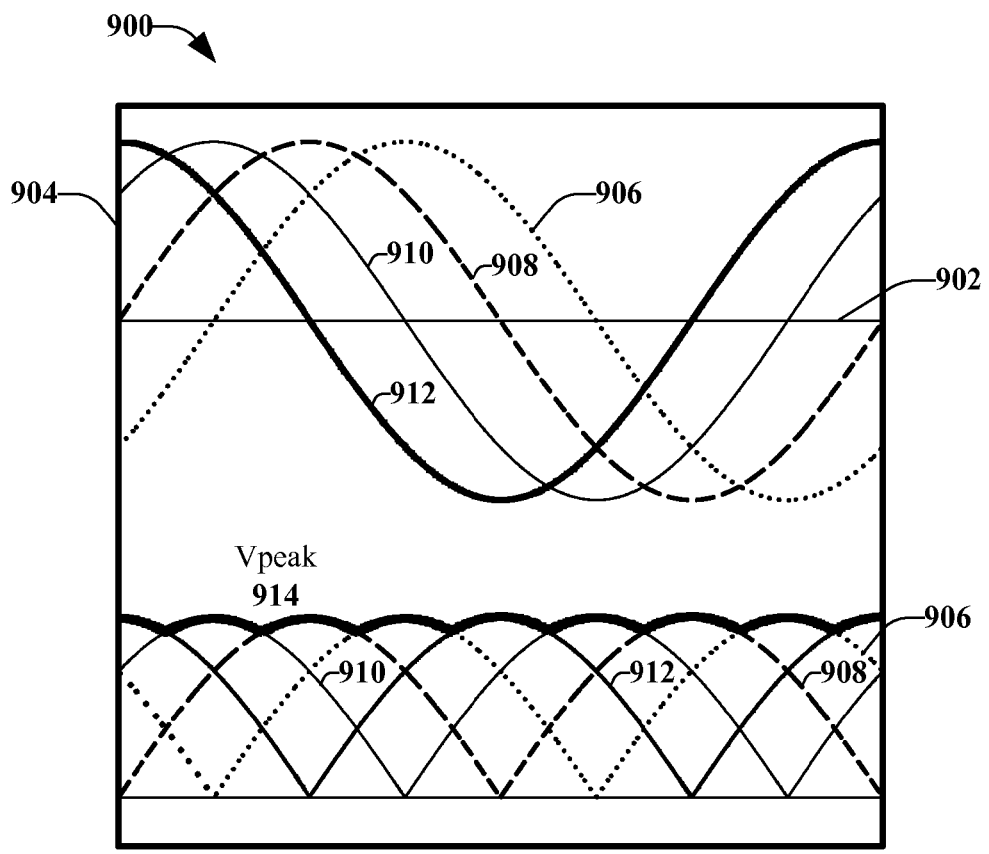
FIG. 9 illustrates a chart of waveforms associated with the sensed voltages from the circuit shown in FIG. 8.

Waveforms associated with the sensed voltages are indicated in the exemplary chart 900 of FIG. 9. As illustrated in the top of FIG. 9, the horizontal axis 902 represents time and the vertical axis 904 represents magnitude. Also illustrated are four waveforms, a first waveform 906 represents the first voltage Vs1 826 (of FIG. 8), the second waveform 908 represents the second voltage Vs2 828 (of FIG. 8), the third waveform 910 represents the third voltage Vs3 830 (of FIG. 8), and the fourth waveform 912 represents the fourth voltage Vs4 832 (of FIG. 8). As illustrated, each waveform has a different phase shift.

Although the waveforms are illustrated as having a similar magnitude, in some aspects, one or more waveforms can have a different magnitude than the other waveforms. The one or more waveforms having the different magnitude can be calibrated (e.g., by adjustment component 104 of FIG. 1, or by one or more other components).

The four signals (or waveforms) can be rectified. The rectification can be full-wave rectification, which converts both polarities of the input waveform (e.g., each of the four waveforms) to direct current. For example, a full-wave rectifier, which converts the entire input waveform (or each of the input waveforms) to a waveform having a constant polarity (positive or negative), can be utilized. In some aspects, more than one full-wave rectifier can be utilized. Rectification of the four waveforms is illustrated at the bottom of the figure, where the same reference numbers as the non-rectified waveforms (at the top of the figure) are utilized for simplicity. After rectification of the four signals, a peak voltage Vpeak 914 of the four rectified signals is ascertained. The peak voltage Vpeak 914 is utilized as the first DC value Vd, according to an aspect.

Figure 10:
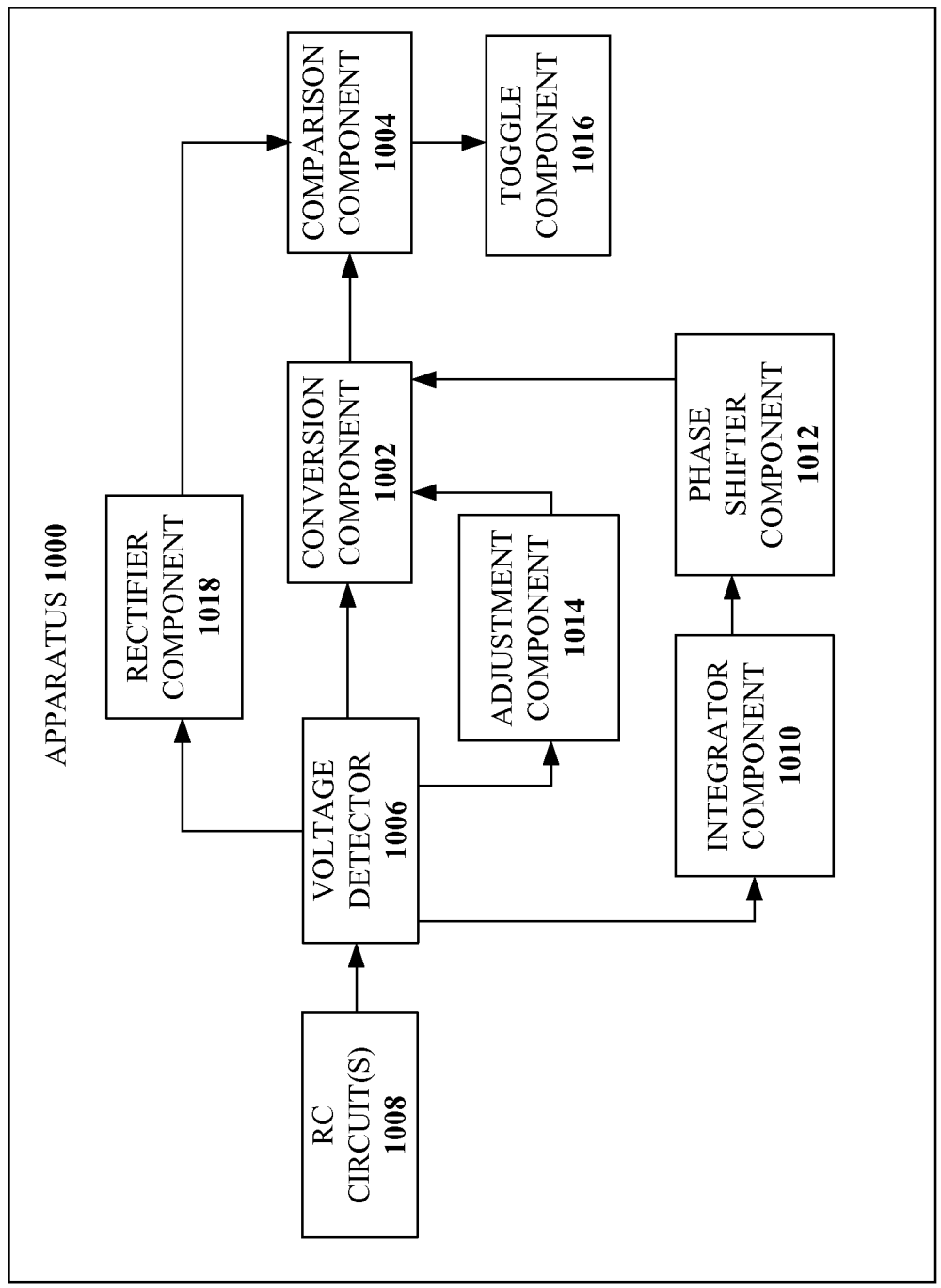
FIG. 10 illustrates an apparatus configured to detect an alternating current line fault at substantially the same time that the fault occurs.

FIG. 10 illustrates an apparatus 1000 configured to detect an AC line fault failure at substantially the same time as the fault occurs, according to an aspect. Included in the apparatus 1000 is a conversion component 1002 configured to transform a first AC voltage signal Vs1 and a second AC voltage signal Vs2 into two DC values. In accordance with some aspects, the first DC value represents instantaneous root mean square voltage level of the first alternating current voltage signal.

Also included in apparatus 1000 is a comparison component 1004 configured to evaluate the two DC values for an AC line fault. The AC line fault is indicated based on the magnitude of the first DC value Vd. For example, it can be determined that an AC line fault has occurred if the first instantaneous DC voltage value is not indicative of the required root mean square voltage of the first alternating current voltage signal. In some implementations, the comparison component 1004 (or another component) is configured to determine, or is programmed with, the required AC RMS voltage or AC RMS voltage range.

In accordance with some aspects, the first DC value is proportional to an AC RMS voltage. In an aspect, the second DC value represents the difference in magnitude between the first AC voltage signal and the second AC voltage signal. For example, under normal condition wherein no AC line fault has occurred, the first AC voltage signal and the second AC voltage signal can be separated by about 90 degrees and have similar or same magnitudes.

Also included in apparatus 1000 is at least one voltage detector 1006 configured to sense the first AC voltage signal from at least two nodes within a circuit. For example, a first voltage signal can be sensed from a resistive branch and the second AC voltage signal can be sensed from a resistor-capacitor branch 1008 of the circuit. In an example, the at least one voltage detector 1006 can be configured to sense the second AC voltage signal at a node between a capacitor and a resistor of the RC circuit branch (e.g., between the first capacitor C1 208 and the third resistor R3 210, both of FIG. 2).

In accordance with an implementation, the at least one voltage detector 1006 is configured to obtain the first AC voltage signal at a node within a resistive branch. For example, the first AC voltage signal can be obtained at a node between the first resistor R1 204 and the second resistor R2 206, both of FIG. 2.

In another implementation, an RC circuit is not utilized to sense the second AC voltage signal. Further to this implementation, an integrator component 1010 is configured to pass an AC portion of the first AC voltage signal and block (or not allow passage of) a DC signal associated with the first AC voltage signal. A phase shifter component 1012 is configured to shift phase of the AC portion by about 90 degrees. An output of the phase shifter component 1012 is utilized as the second AC voltage signal and is sent to the conversion component 1002.

In accordance with some aspects, apparatus 1000 includes an adjustment component 1014 configured to calibrate the second AC voltage signal such that a first magnitude of the first AC voltage signal is substantially the same as a second magnitude of the second AC voltage signal. The calibrated second AC voltage signal is provided to the conversion component 1002.

Also included in apparatus 1000 is a toggle component 1016 configured to suspend use of a primary power source upon detection of the AC line fault. The toggle component can include a transition switch. In some aspects, the toggle component 1016 is further configured to implement usage of a backup power source at substantially the same time as detection of the primary power source failure.

In some implementations, the apparatus 1000 includes one or more RC circuits 1008. In an example, several RC circuits are coupled to each other in parallel, and each RC circuit has a different phase shifting capability. The voltage detector 1006 can be configured to detect a plurality of alternating current waveforms generated by the phase shifters. Further to this aspect, a rectifier component 1018 is configured to rectify the plurality of AC waveforms to produce a peak voltage. The peak voltage is provided to the comparison component 1004, which is further configured to detect the line fault as a function of the peak voltage, which is utilized as the first DC value Vd.

Figure 11:
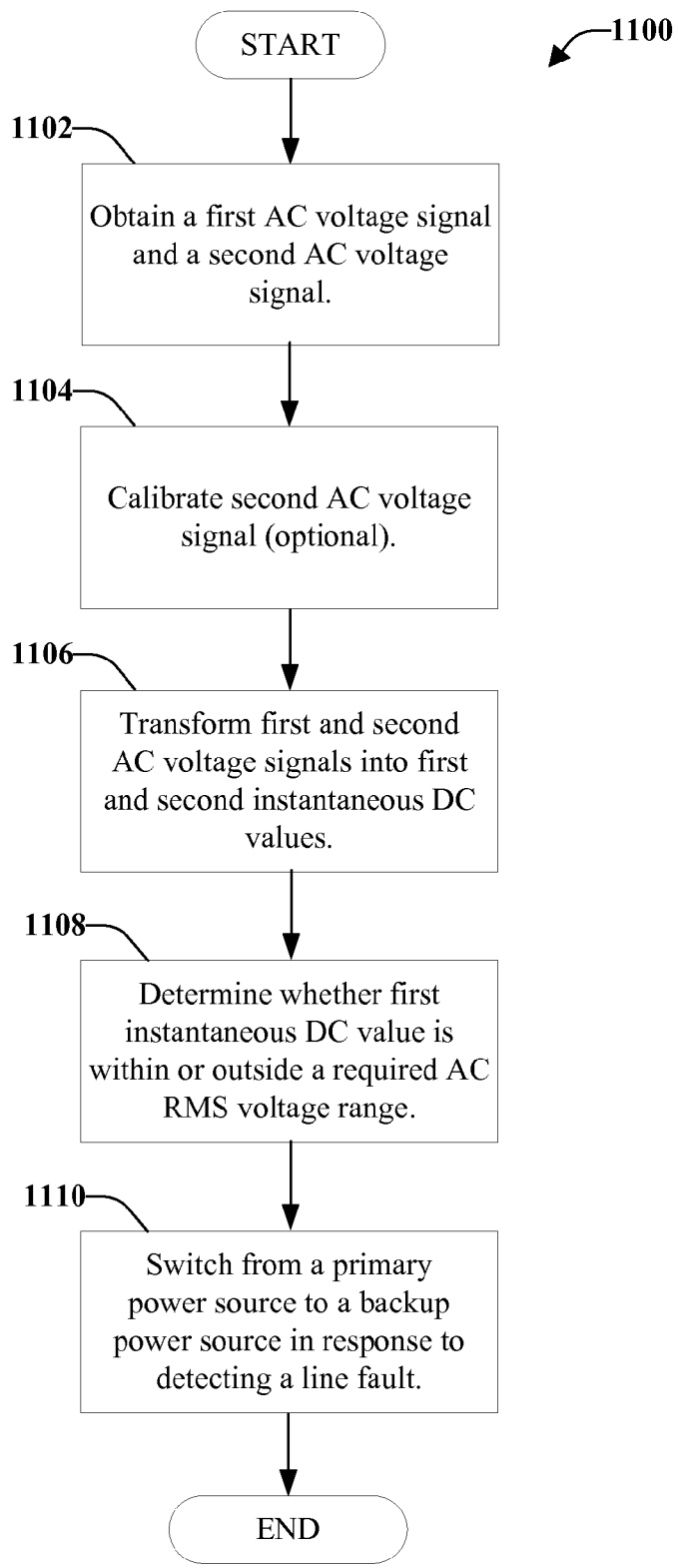
FIG. 11 illustrates an exemplary method for determining that an alternating current line fault has occurred.

FIG. 11 illustrates a method 1100 for determining an AC line fault has occurred, according to an aspect. Method 1100 can be utilized in various applications in order to instantaneously detect an AC line fault. The quick fault detection can be utilized to automatically change power supplies in order to provide continuous coverage if a fault does occur. For example, a switch can be applied that transfers from a primary power source to a backup power source in order to provide continuous power coverage.

Method 1100 starts, at 1102, when a first AC voltage signal and a second AC voltage signal, associated with a primary power source, are obtained. In some aspects, an RC circuit is utilized to obtain the second AC voltage signal. According to this aspect, due to tolerances of either or both a capacitor and a resistor of the RC circuit, the magnitude of the first AC voltage signal might be different from the magnitude of the second AC voltage signal. Thus, at 1104, the second AC voltage signal is calibrated such that the magnitude of the first AC voltage signal is about the same as the magnitude of the second AC voltage signal. The result of the calibration is a calibrated second AC voltage signal.

At 1106, the first AC voltage signal and the second AC voltage signal are transformed into DC values. In an aspect, the first DC value represents an instantaneous root mean square voltage level of the first alternating current voltage signal.

At 1108, it is determined that the first instantaneous DC value is not indicative of the required root mean square voltage of the AC line voltage signal provided by the primary power source. Based on this determination, at 1110, a switch is made from a primary power source to a backup power source. For example, use of the primary power source can be stopped and, at about the same time, use of the backup power source is started in order to provide nearly continuous power.

Figure 12:
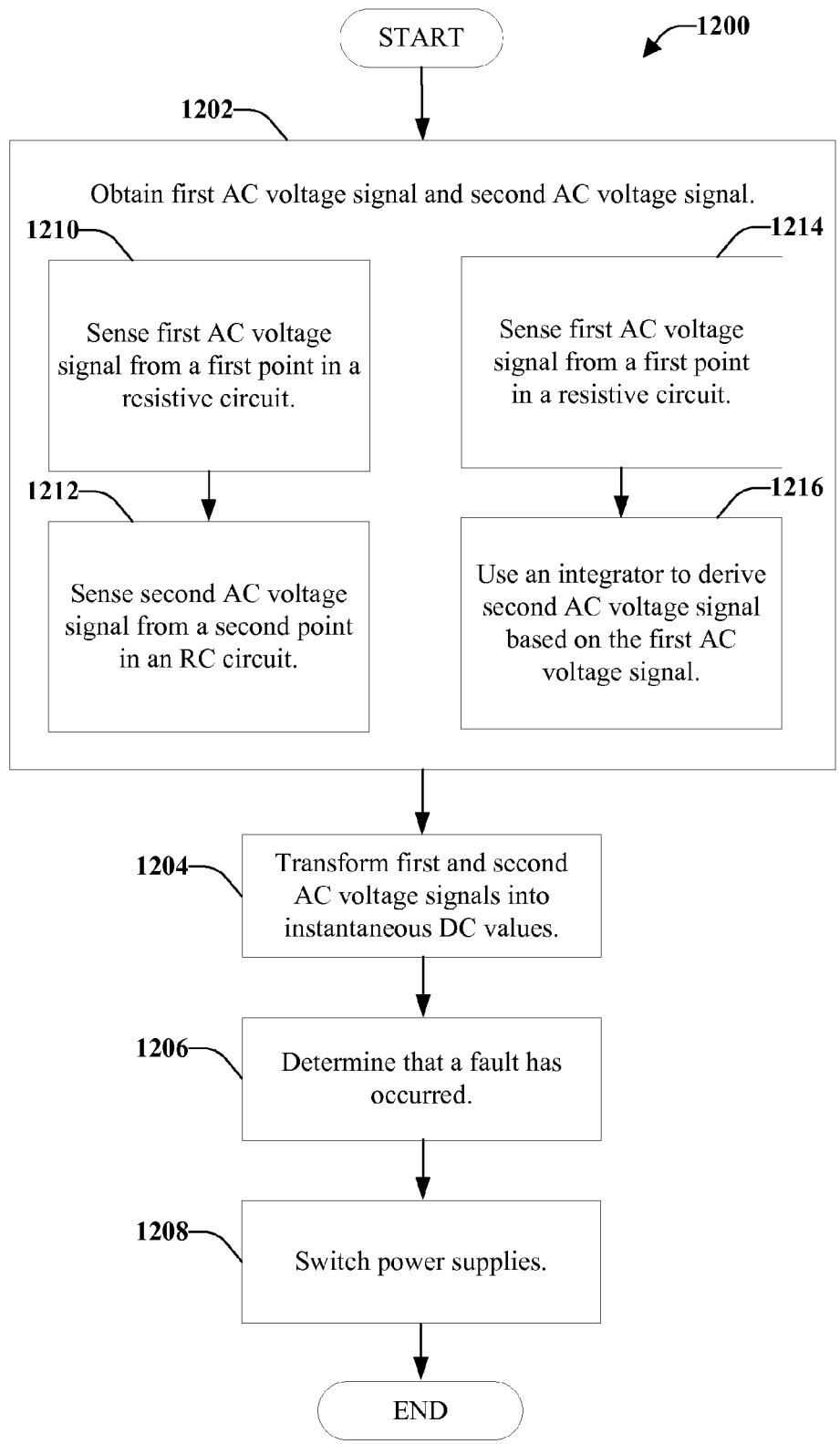
FIG. 12 illustrates another exemplary method for determining that an alternating current line fault has occurred.

FIG. 12 illustrates another method 1200 for determining an AC line fault has occurred, according to an aspect. At 1202, a first AC voltage signal and a second AC voltage signal are obtained and, at 1204, the first and second AC voltage signals are transformed into instantaneous DC voltage values. At 1206, a determination that an AC line fault has occurred is made by observing that the first instantaneous DC value is does not fall within an expected RMS voltage range. Based on the AC fault detection, at 1208, the primary power source that was being used when the AC line fault occurred is no longer used. For example, when the fault associated with the primary power source is detected, there is an automatic transfer from the primary power source to a backup power source.

In an implementation, obtaining the AC current signals, at 1202, includes sensing, at 1210, the first AC voltage signal directly from a first node in a resistive branch (e.g., between a first resistor and a second resistor). At 1212, the second AC voltage signal is measured at a second node in a RC circuit. In an aspect, the measurement, at 1212, includes measuring the second AC voltage signal at the second node located between a capacitor and a resistor of the RC circuit.

In an alternative implementation, obtaining the AC voltage signals, at 1202, includes, at 1214, sensing the first AC voltage signal at a first node (e.g., between a first resistor and a second resistor). Further to this implementation, at 1216, an integrator is utilized to derive the second AC voltage signal based on the first AC voltage signal. In an aspect, the integrator blocks any DC signal(s) associated with the first AC voltage signal and allows the AC voltage signal to pass through the integrator. The AC voltage signal output of the integrator is then 90 degrees phase shifted and utilized as the second voltage signal.

Figure 13:
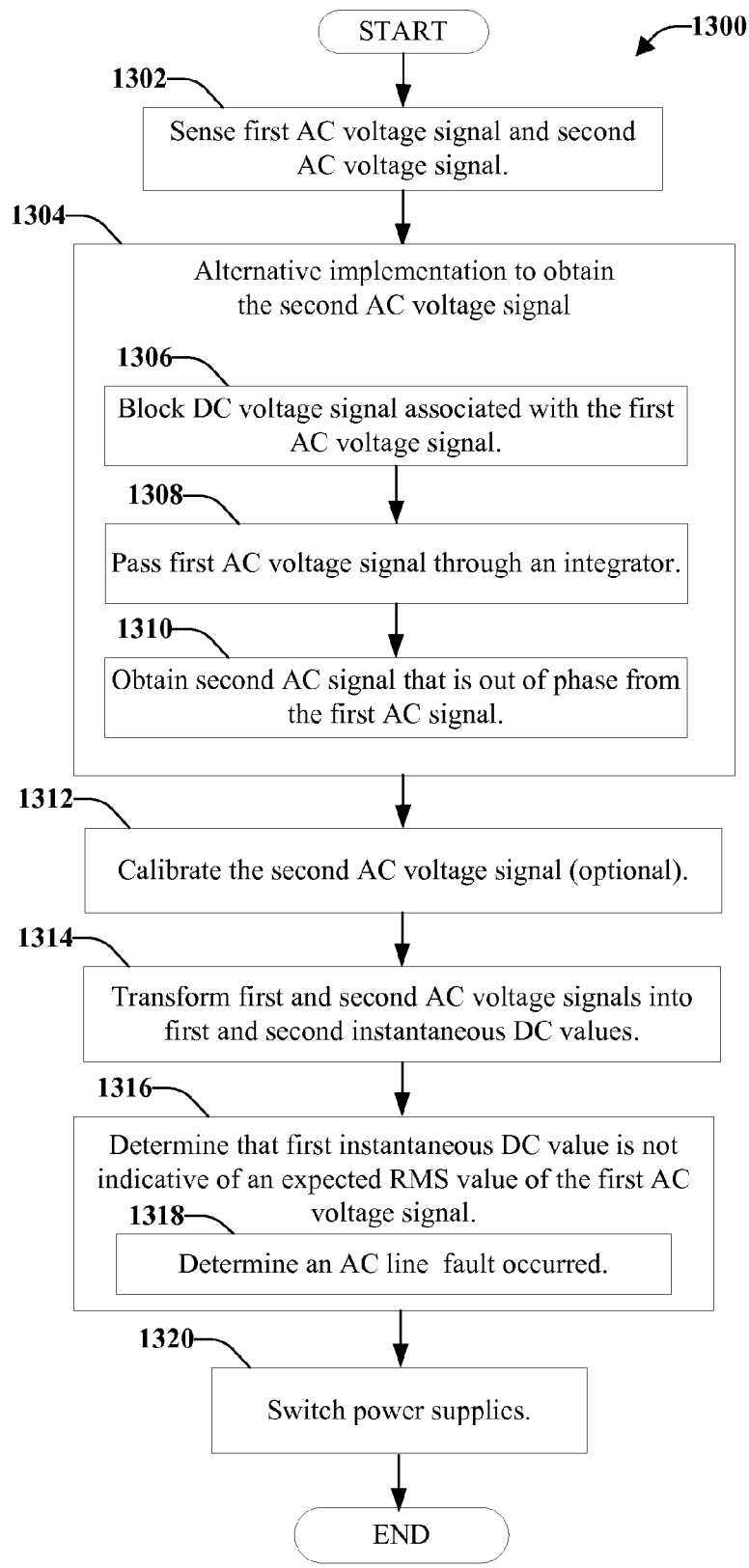
FIG. 13 illustrates a further exemplary method for determining that an alternating current line fault has occurred.

FIG. 13 illustrates a further method 1300 for determining an AC line fault has occurred, according to an aspect. At 1302, first and second AC voltage signals associated with a primary power source are obtained. In an aspect, the first AC voltage signal can be sensed from a resistive circuit and the second AC voltage signal can be sensed from a resistor-capacitor circuit.

At 1304, an alternative implementation to obtain the second AC signal is shown. In accordance with this implementation, the transforming includes blocking a DC signal associated with the first AC voltage signal, at 1306, and passing only the first AC voltage signal through integrator, at 1308. At 1310, a polarity of the AC portion that passed through the integrator is changed in order to obtain the second AC signal.

At 1312, the second AC voltage signal can be calibrated. For example, the second AC voltage signal can be calibrated such that a magnitude of the second AC voltage signal is similar to or same as the magnitude of the first AC voltage signal.

The first and second AC voltage signals are transformed, at 1314, into first and second DC values. For example, a transform matrix, such as the transform matrix discussed above (e.g., Equations 1-3) can be utilized.

Method 1300 continues, at 1316, when it is determined that the first instantaneous DC value is not within a predetermined range that is indicative of the required RMS AC line voltage. In an implementation, the determination can result in a conclusion that an AC line fault has occurred, at 1318. Based on that determination, at 1316 and/or 1318, a switch from a primary power source to a backup power source is implemented, at 1318.

Reference throughout this specification to "one aspect", "an aspect", or the like means that a particular feature, structure, or characteristic described in connection with the aspect is included in at least one aspect. Thus, the appearances of the phrase "in one aspect", "in an aspect", or the like in various places throughout this specification are not necessarily all referring to the same aspect. Furthermore, the particular features, structures, or characteristics may be combined in any suitable manner in one or more aspects.

As used in this application, the terms "component" "system," or the like are generally intended to refer to a computer-related entity, either hardware (e.g., a circuit), a combination of hardware and software, software, or software in execution or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Further, the word "coupled" is used herein to mean direct or indirect electrical or mechanical coupling.

The systems and processes described herein can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders that are not illustrated herein.

In view of the exemplary systems described above, methodologies that may be implemented in accordance with the described subject matter can also be appreciated with reference to the flowcharts of the various figures. While for purposes of simplicity of explanation, the methodologies are shown and described as a series of blocks, it is to be understood and appreciated that the various implementations are not limited by the order of the blocks, as some blocks may occur in different orders and/or concurrently with other blocks from what is depicted and described herein. Where non-sequential, or branched, flow is illustrated via flowchart, it can be appreciated that various other branches, flow paths, and orders of the blocks, may be implemented which achieve the same or a similar result. Moreover, not all illustrated blocks may be required to implement the methodologies described hereinafter.

What has been described above includes examples of the implementations of the disclosed aspects. It is, of course, not possible to describe every conceivable combination of components or methods for purposes of describing the claimed subject matter, but it is to be appreciated that many further combinations and permutations of the disclosed aspects are possible. Accordingly, the claimed subject matter is intended to embrace all such alterations, modifications, and variations that fall within the spirit and scope of the appended claims. Moreover, the above description of illustrated aspects of the subject disclosure, including what is described in the Abstract, is not intended to be exhaustive or to limit the disclosed aspects to the precise forms disclosed. While specific aspects and examples are described herein for illustrative purposes, various modifications are possible that are considered within the scope of such aspects and examples, as those skilled in the relevant art can recognize.

In particular and in regard to the various functions performed by the above described components, devices, circuits, systems and the like, the terms used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable storage medium having computer-executable instructions for performing some of the acts and/or events of the various methods of the claimed subject matter.

The aforementioned systems, circuits, modules, and so on have been described with respect to interaction between several components and/or blocks. It can be appreciated that such systems, circuits, components, blocks, and so forth can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but known by those of skill in the art.

In addition, while a particular feature of the disclosed aspects may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A method comprising:
using an alternating current (AC) primary power source in parallel with a resistor divider circuit;
using a first resistor-capacitor (RC) circuit in parallel with the resistor divider circuit;
sensing a first AC voltage signal at a node in the resistor divider circuit;
sensing a second AC voltage signal at a node in the first RC circuit;
using the first and second sensed AC voltage signals to determine first and second values; and
determining that a fault has occurred if the first value is not indicative of the required root mean square (RMS) value of a line voltage provided by the primary power source.

2. The method of claim 1, wherein using the RC circuit to cause an approximately 90 degrees phase shift of the first AC signal.

3. The method of claim 1, wherein the first value is determined by transforming both the first AC signal and the second AC signal.

4. The method of claim 1, wherein the first value includes an instantaneous direct current (DC) voltage value.

5. The method of claim 4, wherein the first value is determined as a function of time and is based on instantaneous amplitude of the first AC voltage signal.

6. The method of claim 1, wherein the first value is directly proportional to an instantaneous RMS value of a line voltage provided by the primary power source.

7. The method of claim 1, comprising calibrating the amplitude of second AC voltage signal prior to using the first and second AC voltage signals to determine the first and second values, wherein the calibrating causes the amplitudes of the first and the second AC voltage signals to become approximately equal.

8. The method of claim 1, wherein the required RMS value is defined by a range of voltages.

9. The method of claim 1, wherein determining that a fault has occurred includes determining that the first value is below a predetermined direct current (DC) voltage value.

10. A method comprising:
   using an alternating current (AC) primary power source in parallel with a resistor divider circuit;
   sensing a first AC voltage signal at a node in the resistor divider circuit;
   phase shifting the first AC voltage signal by 90 degrees to generate a second AC voltage;
   using the first and second AC voltage signals to determine first and second values; and
   determining that a fault has occurred if the first value is not indicative of the required root mean square (RMS) value of a line voltage provided by the primary power source.

11. The method of claim 10, further comprising: performing the phase shifting after passing the first AC voltage signal through an integrator.

12. The method of claim 11, wherein passing the AC voltage signal through the integrator to block a DC voltage signal associated with the first AC voltage signal.

13. A circuit, comprising:
   a primary AC power source coupled in parallel to a resistor divider component;
   the resistor divider component including a first node configured to be coupled to a detection component that senses a first AC voltage signal;
   a first resistor-capacitor (RC) component coupled in parallel to the resistor divider component and including a second node configured to be coupled to the detection component that senses a second AC voltage signal; and
   the first and second nodes configured to be coupled to a microcontroller; wherein, the microcontroller comprises:
   a conversion component configured to transform the first and second AC voltage signals into first and second values; and
   a comparison component configured to determine that a line fault has occurred if the first value is not indicative of the required root mean square (RMS) value of a line voltage provided by the primary power source.

14. The circuit of claim 13, wherein the comparison component is configured to compare the first value with a predetermined value to determine if the first value is indicative of the required root mean square (RMS) value of the line voltage provided by the primary power source.

15. The circuit of claim 13, wherein the comparison component is configured to compare the first value with a range of predetermined values to determine if the first value is indicative of the required root mean square (RMS) value of the line voltage provided by the primary power source.

16. The circuit of claim 13, wherein the first value is directly proportional to an instantaneous RMS value of the line voltage provided by the primary power source.

17. The circuit of claim 13, wherein the second sensed AC voltage signal is approximately 90 degrees out of phase with the first sensed AC voltage signal.

18. The circuit of claim 13, wherein the microcontroller includes a programmable microcontroller.

19. The circuit of claim 13, further comprising:
   a toggle switch coupled to the primary power source and configured to decouple the primary power source and couple a backup power source in response to determining that a line fault has occurred.

20. The circuit of claim 13, wherein the capacitor includes an electromagnetic interference (EMI) capacitor.

* * * * *